United States Patent
Hsu

(10) Patent No.: US 7,382,629 B2
(45) Date of Patent: Jun. 3, 2008

(54) CIRCUIT SUBSTRATE AND METHOD OF MANUFACTURING PLATED THROUGH SLOT THEREON

(75) Inventor: Chi-Hsing Hsu, Hsin-Tien (TW)

(73) Assignee: VIA Technologies, Inc., Taipei Hsien (TW)

( * ) Notice: Subject to any disclaimer, the term of this patent is extended or adjusted under 35 U.S.C. 154(b) by 141 days.

(21) Appl. No.: 11/510,300

(22) Filed: Aug. 25, 2006

(65) Prior Publication Data

US 2007/0017697 A1 Jan. 25, 2007

Related U.S. Application Data

(60) Continuation-in-part of application No. 11/295,786, filed on Dec. 6, 2005, now abandoned, which is a division of application No. 11/078,123, filed on Mar. 9, 2005, now abandoned.

(30) Foreign Application Priority Data

May 11, 2004 (TW) .................... 93113135 A

(51) Int. Cl.
*H05K 1/11* (2006.01)
(52) U.S. Cl. .................. 361/794; 361/792; 361/793; 361/795; 174/255; 174/262
(58) Field of Classification Search ................. 361/794, 361/780
See application file for complete search history.

(56) References Cited

U.S. PATENT DOCUMENTS

| | | | | |
|---|---|---|---|---|
| 4,295,112 A * | 10/1981 | Yamada et al. | .......... | 336/84 M |
| 5,374,788 A * | 12/1994 | Endoh et al. | ................ | 174/266 |
| 5,528,205 A * | 6/1996 | Wong | .......................... | 333/177 |
| 5,587,885 A * | 12/1996 | Swamy | ........................ | 361/777 |
| 5,898,576 A * | 4/1999 | Lockwood et al. | .......... | 361/782 |
| 5,949,030 A * | 9/1999 | Fasano et al. | .............. | 174/262 |
| 6,002,593 A * | 12/1999 | Tohya et al. | ................. | 361/765 |
| 6,137,168 A * | 10/2000 | Kirkman | ...................... | 257/691 |
| 6,239,485 B1 * | 5/2001 | Peters et al. | ................. | 257/700 |
| 6,411,519 B2 * | 6/2002 | Asai et al. | ................... | 361/794 |
| 6,418,032 B2 * | 7/2002 | Hirata et al. | ................. | 361/780 |
| 6,787,710 B2 * | 9/2004 | Uematsu et al. | ............. | 174/261 |
| 6,798,666 B1 * | 9/2004 | Alexander et al. | ........... | 361/766 |
| 7,068,518 B2 * | 6/2006 | Ueno et al. | ................... | 361/760 |
| 2003/0085055 A1 * | 5/2003 | Skinner et al. | .............. | 174/255 |

\* cited by examiner

*Primary Examiner*—Tuan Dinh
*Assistant Examiner*—Hoa C Nguyen
(74) *Attorney, Agent, or Firm*—J.C. Patents

(57) ABSTRACT

A circuit substrate and a method of manufacturing a slot-shaped plated through slot thereon are provided. The circuit substrate has a linear slot. A slot-shaped plated through hole with a multiple transmission paths is formed in the linear slot so that a multiple of signals can be transmitted through the linear slot at one time. The circuit substrate and the method of manufacturing the slot-shaped plated through hole thereon can increase the level of integration of the circuit, decrease the average routing length of the circuit, boost the production efficiency and lower the production cost.

16 Claims, 16 Drawing Sheets

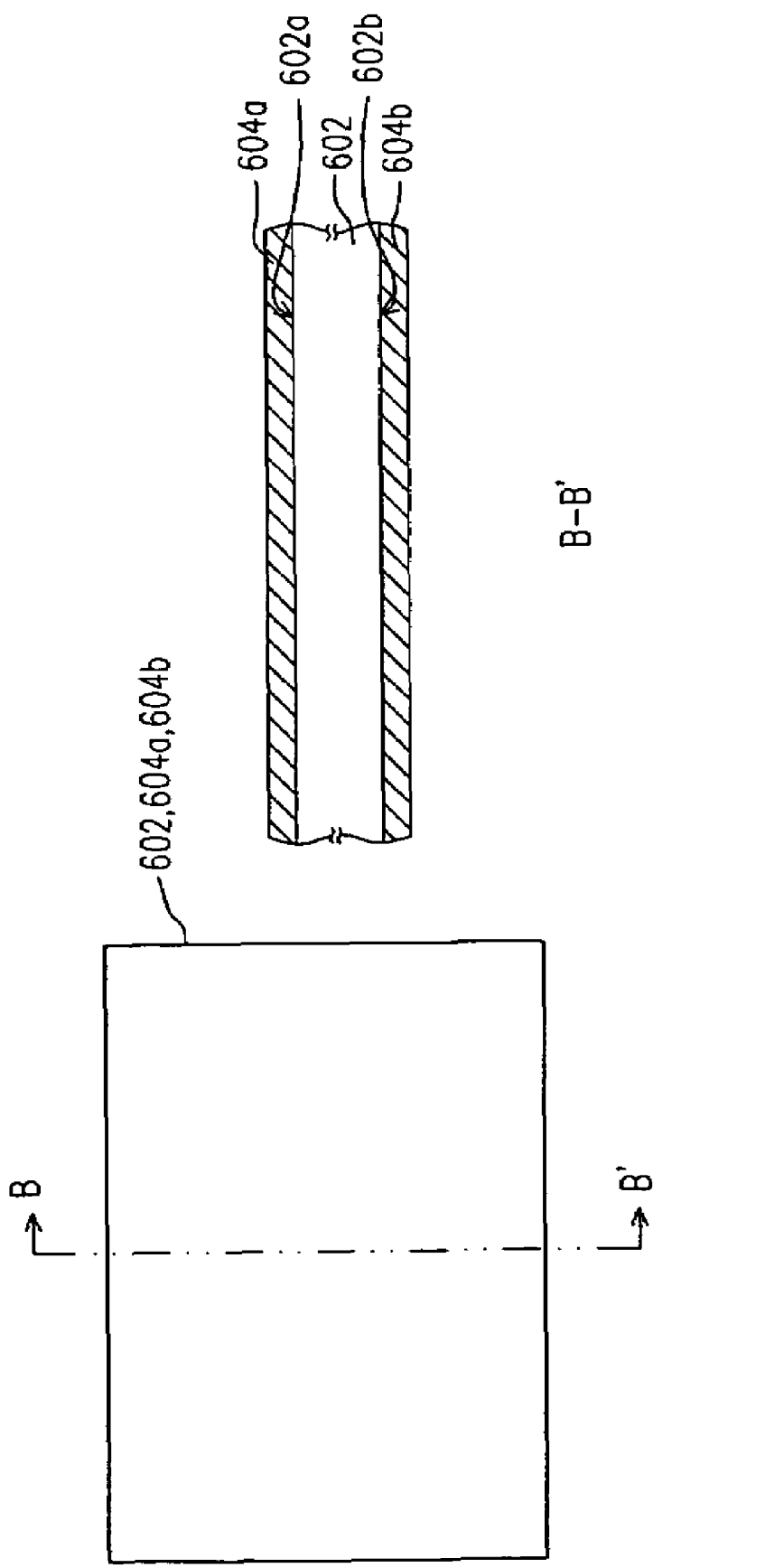

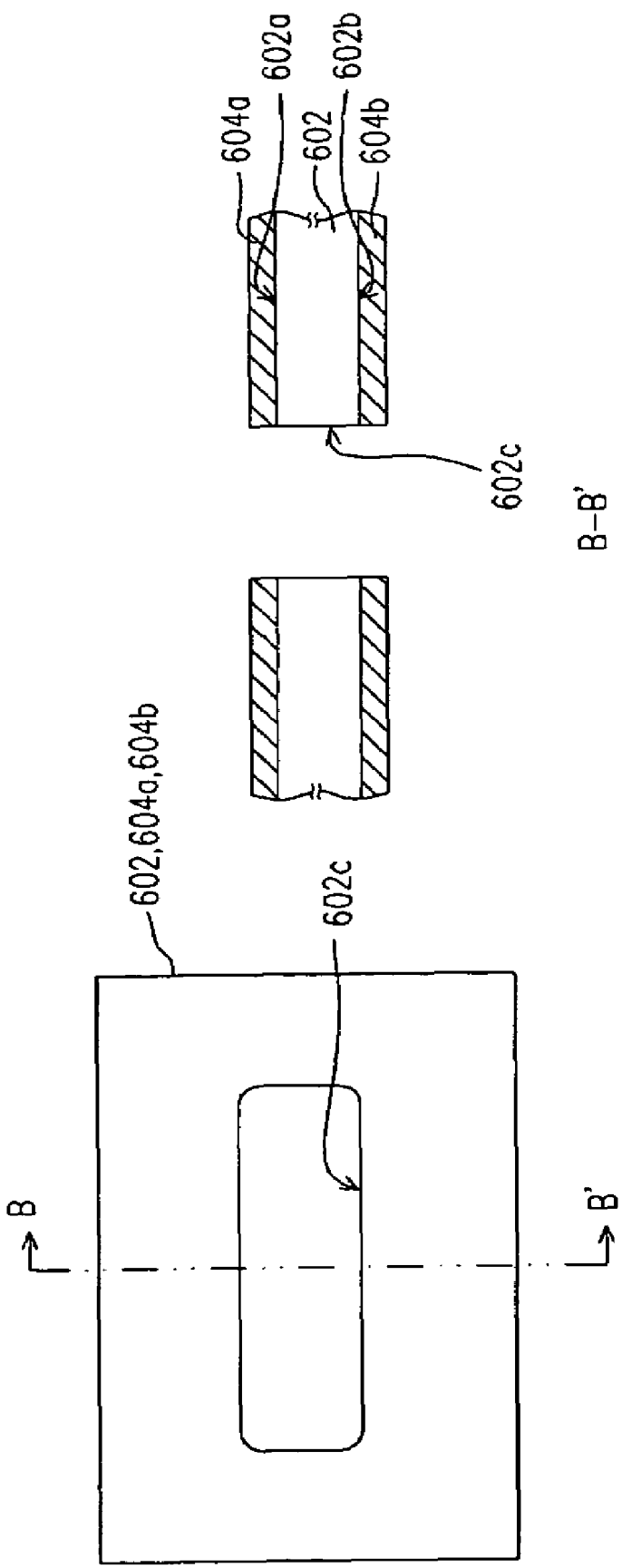

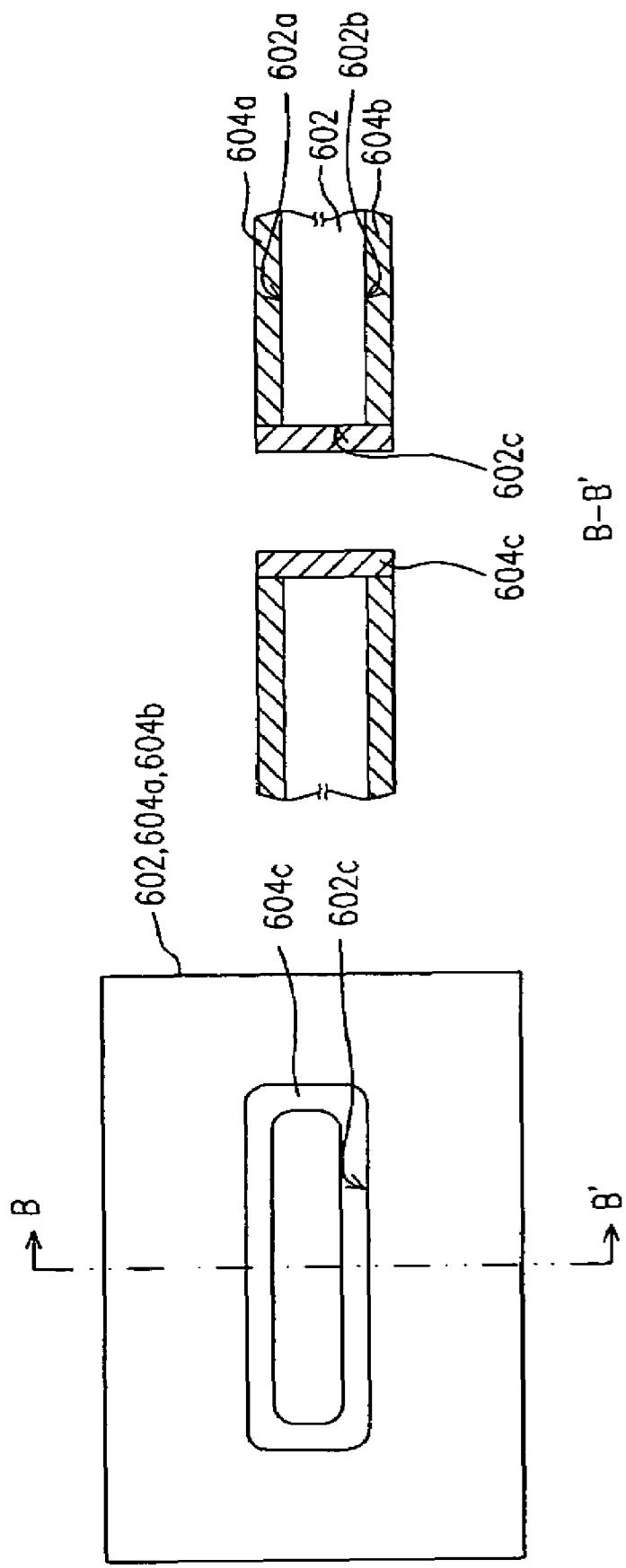

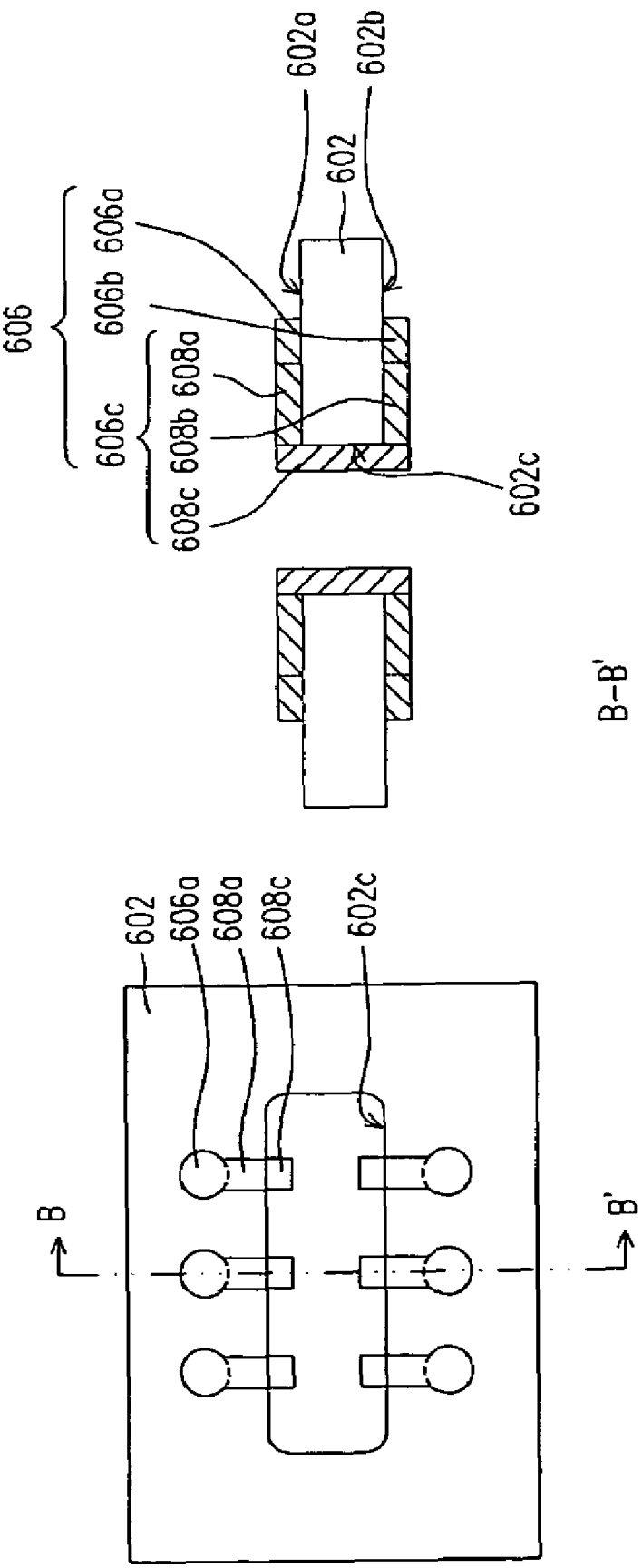

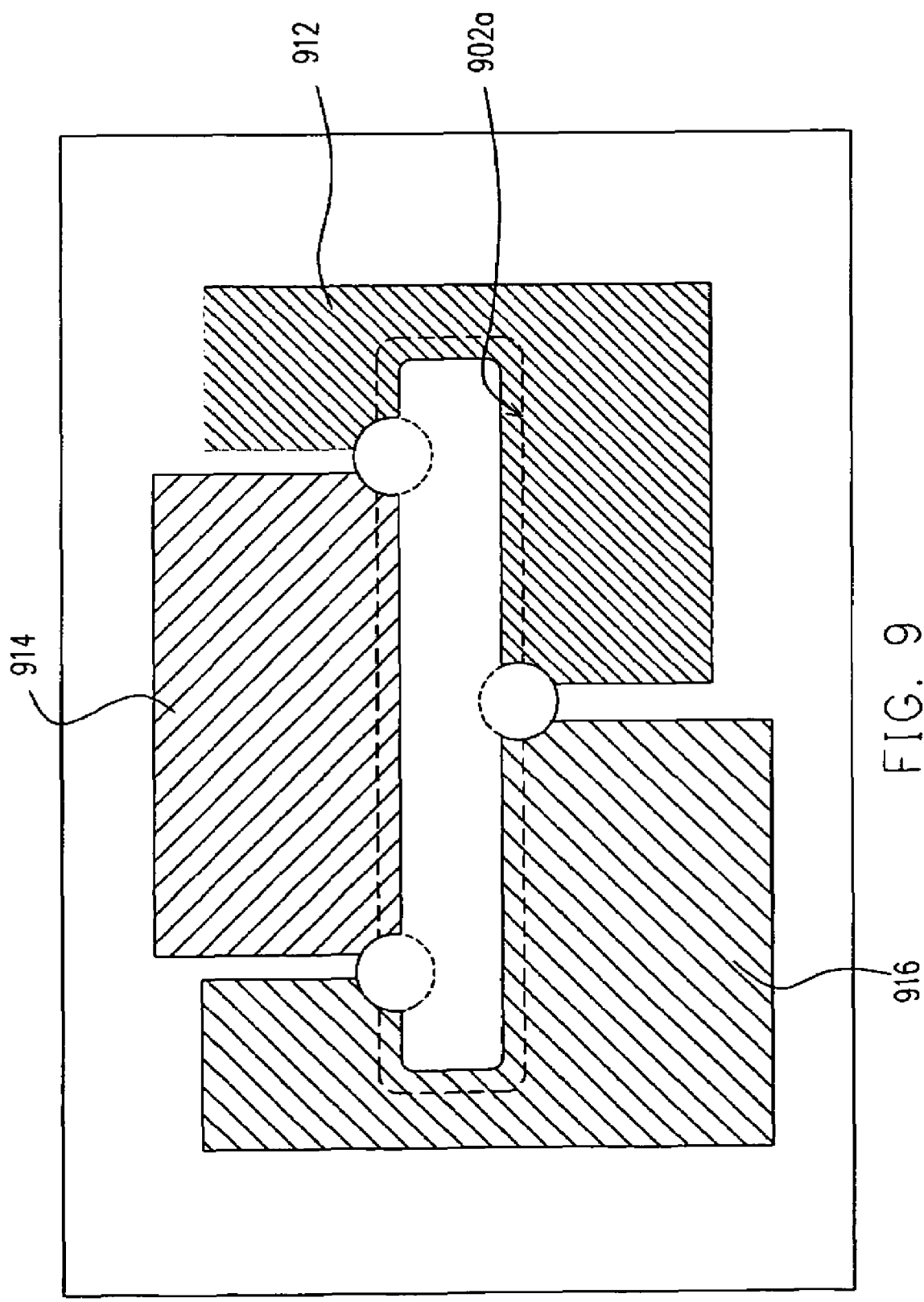

CIRCUIT SUBSTRATE AND METHOD OF MANUFACTURING PLATED THROUGH SLOT THEREON

CROSS-REFERENCE TO RELATED APPLICATION

This application is a continuation-in-part of a prior application Ser. No. 11/295,786, filed Dec. 6, 2005 now abandoned. The prior application Ser. No. 11/295,786 is a divisional application of a prior application Ser. No. 11/078,123, filed Mar. 9, 2005 now abandoned which claims the priority benefit of Taiwan application serial no. 93113135, filed on May 11, 2004.

BACKGROUND OF THE INVENTION

1. Field of the Invention

The present invention relates to a circuit substrate and a method of manufacturing plated through hole thereon. More particularly, the present invention relates to a circuit substrate having slot-shaped plated through holes and a method of manufacturing the plated through hole on the circuit substrate.

2. Description of the Related Art

With big advance in the manufacturing techniques of electronic devices, the goal of the electronic device manufacturers is to produce multi-functional and highly miniaturized products. This has lead to a significant improvement in fabricating semiconductor devices with a higher level of integration. To reduce overall size of a packaged chip, smaller and more complex package technologies such as flip chip package technology, ball grid array (BGA) package technology and chip scale package (CSP) technology have been developed by the manufacturers. Furthermore, to increase the circuit density of a printed circuit board (PCB), a build-up process or lamination process has been deployed to fabricate a printed circuit board with a multiple circuit layers. The aforementioned ball grid array packages also uses a package substrate having multiple circuit layers. Yet, both the package substrate and the multi-layered circuit board need to have a plurality of plated through holes (PTH) passing through the dielectric layer(s) of the multi-layered substrate or board for connecting and transmitting signals between different patterned circuit layers.

FIG. 1 is a schematic cross-sectional view of a conventional circuit substrate. As shown in FIG. 1, the circuit substrate 100 is a multi-layered package substrate. The multi-layered package substrate 100 comprises a dielectric core layer 102 having an upper surface 102a, a corresponding lower surface 102b and a through hole 102c passing through the dielectric core layer 102. Furthermore, a plated through hole 104 is formed within the through hole 102c. The plated through hole 104 comprises an upper contact pad 104a, a lower contact pad 104b and a conductive layer 104c on the inner wall of the through hole 102c. The conductive layer 104c connects the upper contact pad 104a and the lower contact pad 104b so that signals from the circuit layers above the dielectric core layer 102 can be transmitted to the circuit layers below the dielectric core layer 102.

The aforementioned plated through holes can be applied to a single-layered or a multi-layered circuit board. Two or more patterned circuit layers are connected through a plated through hole so that signals can be transmitted between them. It should be noted that some useful area on the dielectric core layer for laying circuits has to be sacrificed to form the through hole and its nearby via landing whenever a plated through hole is formed. Furthermore, the circuits on the circuit board have to re-route around the plated through holes. Therefore, the circuit layout on the dielectric core layer will be severely limited when a large number of plated through holes is deployed and the level of circuit integration is difficult to increase.

To combat the layout problem, a plated through hole having a multiple of transmission pathways has been developed in recent years. The technique is to form a plurality of independent transmission pathways inside a single through hole for linking upper and lower circuit layers. Thus, the single plated through hole is able to transmit a plurality of signals at the same time so that the problem of re-routing circuits is greatly minimized and the number of plated through holes within the circuit substrate is significantly reduced.

However, it should be noted that a mechanical drilling or laser drilling method is deployed to form a circular through hole in the dielectric core layer no matter if a single or a multiple transmission plated through hole is formed. Unfortunately, the shape of the circular through holes and the minimum distance from a neighboring through hole presents some overall restrictions on the layout of the circuit. For example, the diameter of the through hole has a lower limit. If the line width on a high-density circuit substrate is about 30 μm, the minimum diameter of the through hole is about 300μ. Hence, together with the via landing around the through hole, the plated through hole occupies a diameter of about 450 μm. In other words, each additional plated through hole in the dielectric core layer takes away at least a circular area with a diameter of about 450 μm. Therefore, the design of the plated through hole and its disposition in the circuit substrate is critical for increasing the level of integration and the performance of the package product.

SUMMARY OF THE INVENTION

Accordingly, at least one objective of the present invention is to provide a circuit substrate having a slot-shaped plated through hole instead of a circular plated through hole so that the circuit layout area of the circuit board is increased and the average circuit re-routing length is shortened.

At least a second objective of the present invention is to provide a method of fabricating a plated through hole in a circuit substrate by forming a linear slot in the circuit substrate so that the circuit layout area on the circuit substrate is increased.

To achieve these and other advantages and in accordance with the purpose of the invention, as embodied and broadly described herein, the invention provides a circuit substrate. The circuit substrate comprises at least a stack layer, a first transmission pathway and at least a second transmission pathway. The stack layer has an upper surface and a corresponding lower surface. The stack layer has a linear slot that passes through the stack layer. Furthermore, the first transmission pathway can be divided into a first upper contact pad, a first lower contact pad and a first transmission line. The first upper contact pad and the first lower contact pad are disposed on the upper surface and the lower surface of the stack layer respectively. The first transmission line is disposed on the inner wall of the linear slot and connects the first upper contact pad and the first lower contact pad. In addition, the second transmission pathway can be divided into a second upper contact pad, a second lower contact pad and a second transmission line. The second upper contact pad and the second lower contact pad are disposed on the upper surface and the lower surface of the stack layer respectively. The second transmission line is disposed on the inner wall of the linear slot and connects the second upper contact pad and the second lower contact pad.

The present invention also provides a method of fabricating a plated through hole on a circuit substrate. First, a stack layer, an upper conductive layer and a lower conductive layer are provided. The upper conductive layer and the lower conductive layer are located on an upper surface and a lower surface of the stack layer. Thereafter, a linear slot is formed passing through the upper conductive layer, the stack layer and the lower conductive layer. A slot conductive layer is formed on the inner wall of the linear slot. Portions of the slot conductive layer is removed to form a first slot line segment and at least an independent second slot line segment. Finally, the upper conductive layer and the lower conductive layer are patterned to form a first upper contact pad and at least a second upper contact pad on the upper surface of the stack layer and a first lower contact pad and at least a second lower contact pad on the lower surface of the stack layer. The first slot line segment connects the first upper contact pad and the first lower contact pad while the second slot line segment connects the second upper contact pad and the second lower contact pad.

The present invention also provides a circuit substrate. The circuit substrate comprises at least a stack layer, an first upper conductive plane, a first lower conductive plane, at least an second upper conductive plane, at least a second lower conductive plane, a first slot conductive wall and at least a second slot conductive wall. The stack layer has a first surface and a corresponding second surface. The stack layer also has a linear slot that passes through the stack layer. Furthermore, the first upper conductive plane and the second upper conductive plane are disposed on the first surface of the stack layer, and the second upper conductive plane surrounds the first upper conductive plane. Similarly, the first lower conductive plane and the second lower conductive plane are disposed on the second surface of the stack layer, and the first lower conductive plane surrounds the second lower conductive plane. In addition, the first slot conductive wall is disposed on the inner wall of the linear slot. The first slot conductive wall connects the first upper conductive plane with the first lower conductive plane. The second slot conductive wall is disposed on the inner wall of the linear slot independent from the first slot conductive wall. The second slot conductive wall connects the second upper conductive plane and the second lower conductive plane.

The present invention also provides a method of fabricating a plated through hole on a circuit substrate. First, a circuit substrate having a stack layer with a first surface and a second surface is provided. A first conductive layer is formed on the first surface of the stack layer, and a second conductive layer is formed on the second surface of the stack layer. Thereafter, a linear slot that passes through the circuit substrate is formed. A slot conductive layer is formed on the inner wall of the linear slot. Portions of the slot conductive layer on the inner wall of the linear slot is removed to form a first slot conductive wall and at least an independent second slot conductive wall. The first conductive layer and the second conductive layer are patterned to form an first upper conductive plane and at least an second upper conductive plane that surrounds the first upper conductive plane on the first surface of the stack layer, and at least a second lower conductive plane and a first lower conductive plane that surrounds the second lower conductive plane on the second surface of the stack layer. The first slot conductive wall connects the first upper conductive plane with the first lower conductive plane while the second slot conductive wall connects the second upper conductive plane and the second lower conductive plane.

In brief, the present invention provides a circuit substrate having a slot-shaped plated through hole. The plurality of transmission pathways inside the slot-shaped plated through hole can be formed by drilling. Through the various transmission pathways inside the plated through hole, a number of signals can be transmitted concurrently. Hence, the circuit design can be more flexible and the level of integration can be increased. Furthermore, the linear slot design of the present invention increases the area on the circuit substrate for laying circuits significantly over a substrate having the conventional circular plated through holes. Moreover, the average re-routing length of circuit is also reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 6A through 6E are schematic top views showing the steps for fabricating a plated through hole according to one preferred embodiment of the present invention.

FIGS. 7A through 7E are schematic cross-sectional views along line B-B' of FIGS. 6A through 6E.

FIGS. 8 and 9 are schematic top views showing the process of removing the conductive layer inside a slot using circular drill bits for fabricating a plated through hole according to the present invention.

DESCRIPTION OF THE PREFERRED EMBODIMENTS

Figure 1:
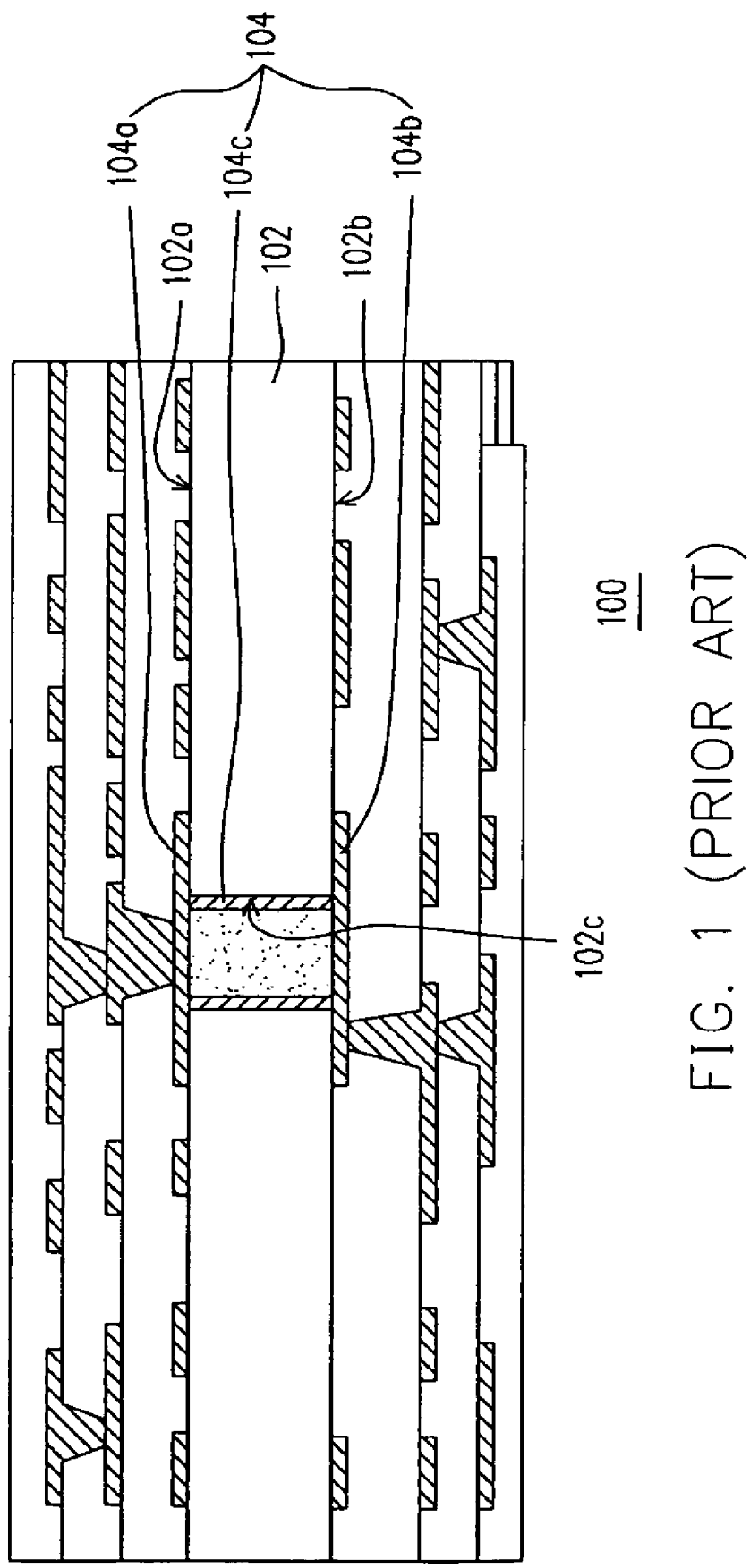
FIG. 1 is a schematic cross-sectional view of a conventional circuit substrate.

Reference will now be made in detail to the present preferred embodiments of the invention, examples of which are illustrated in the accompanying drawings. Wherever possible, the same reference numbers are used in the drawings and the description to refer to the same or like parts.

Figure 2:
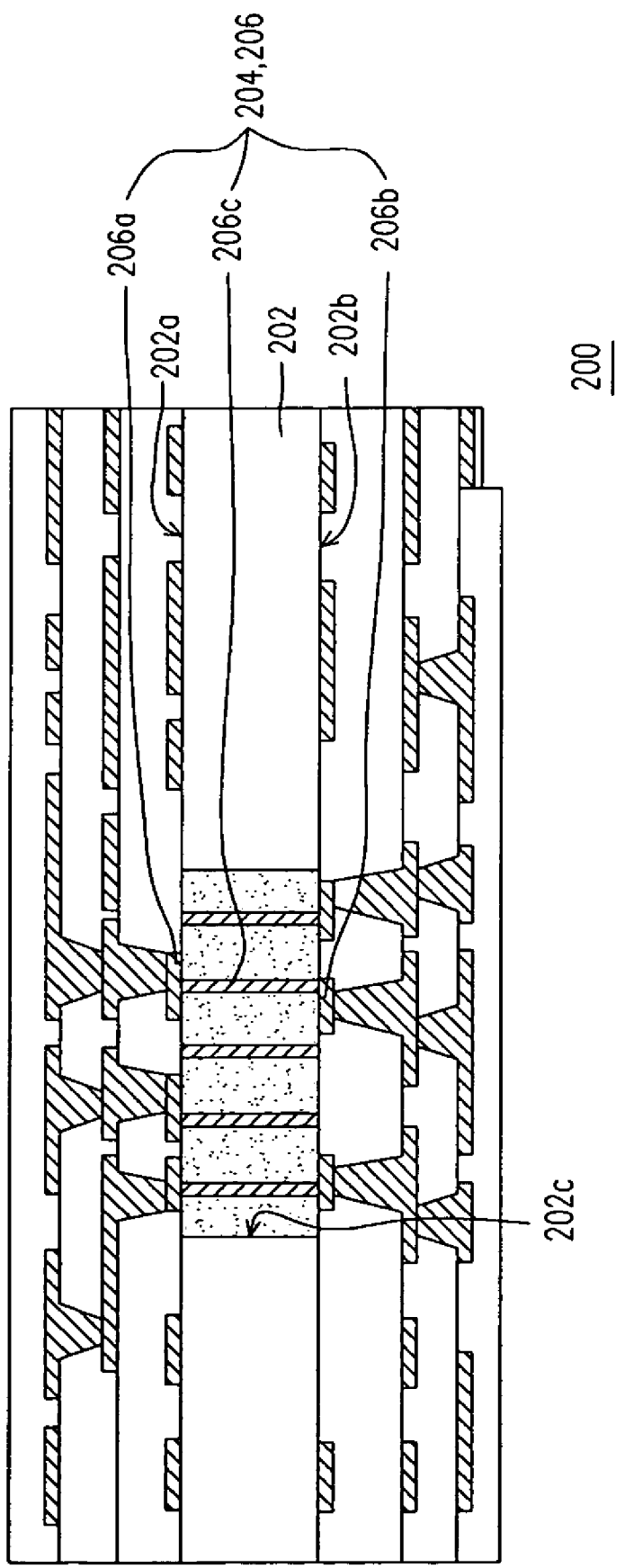
FIG. 2 is a schematic cross-sectional view showing a portion of a circuit substrate according to one preferred embodiment of the present invention.

FIG. 2 is a schematic cross-sectional view showing a portion of a circuit substrate according to one preferred embodiment of the present invention. As shown in FIG. 2, the circuit substrate 200 is a multi-layered package substrate, for example. A plated through hole 204 is disposed on a stack layer 202 inside the circuit substrate 200. The stack layer 202 is a dielectric core layer, for example. Obviously, the plated through hole 204 may connect any two circuit layers within the circuit substrate 200. Aside from a single dielectric layer, the stack layer 202 may comprise a plurality of dielectric layers and at least a conductive layer with the conductive layer positioned between any two neighboring dielectric layers. However, to simplify the explanation, only the case of a plated through hole 204 formed in the dielectric core layer is described.

As shown in FIG. 2, the stack layer 202 has an upper surface 202a and a lower surface 202b. The stack layer 202 also has an I-shaped linear slot 202c that passes through the stack layer 202. Utilizing the linear slot 202c, a slot-shaped plated through hole 204 is formed. The slot-shaped plated through hole 204 of the present invention can have a plurality of transmission pathways 206 providing a plurality of signal transmission routes, for example. Each transmission pathway 206 comprises an upper contact pad 206a, a lower contact pad 206b and a transmission line 206c. The transmission line 206c stretches from the upper surface 202a of the stack layer 202 to the lower surface 202b of the stack layer 202 via the inner wall of the linear slot 202c. The upper contact pad 206a and the lower contact pad 206b are disposed on the upper surface 202a and the lower surface 202b of the stack layer 202 serving as a bonding pad or a via landing. The respective ends of the transmission line 206c are connected to the upper contact pad 206a and the lower contact pad 206b for transmitting signals between the upper and the lower circuit layers.

Figure 3:
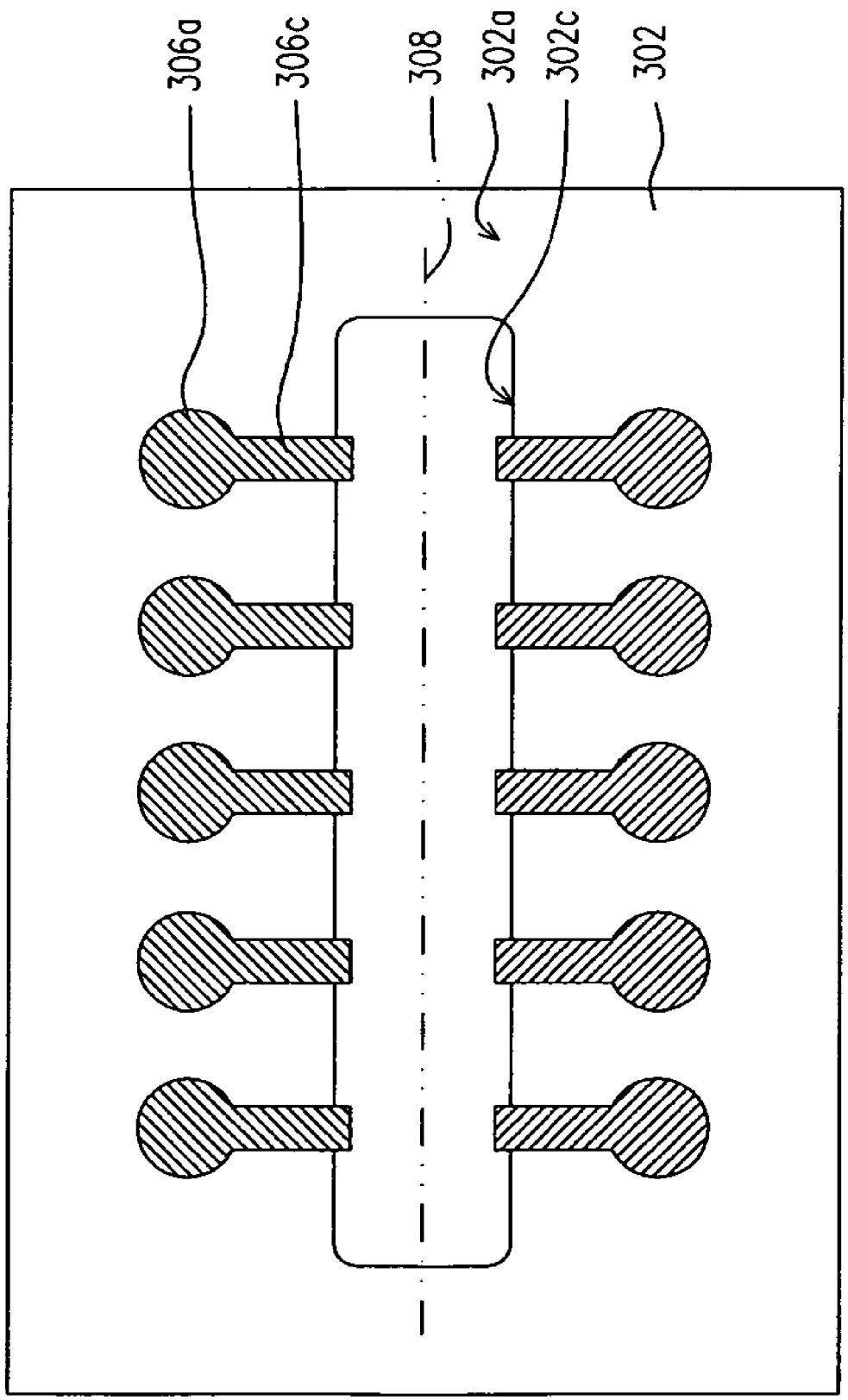
FIG. 3 is a schematic top view showing a portion of a circuit substrate according to one preferred embodiment of the present invention.

Through the aforementioned slot-shaped plated through holes, the circuit substrate of the present invention can provide a plurality of signal transmission routes. FIG. 3 is a schematic top view showing a portion of a circuit substrate according to one preferred embodiment of the present invention. To simplify FIG. 3, only the stack layer and the plated through hole of the circuit substrate is shown. As shown in FIG. 3, a plurality of upper contact pads 306a and a plurality of corresponding transmission lines 306c are disposed on the upper surface 302a of a stack layer 302. Hence, different signals may enter the upper contact pads 306a above the stack layer 302 at the same time and pass them on to various circuits under the stack layer 302 via the transmission lines 306c. Furthermore, the linear slot 302c in the stack layer 302 can accommodate more transmission channels than a conventional circular through hole. Hence, the number of through holes on the circuit substrate can be reduced so that the area for laying circuits is significantly increased.

Figure 4A:
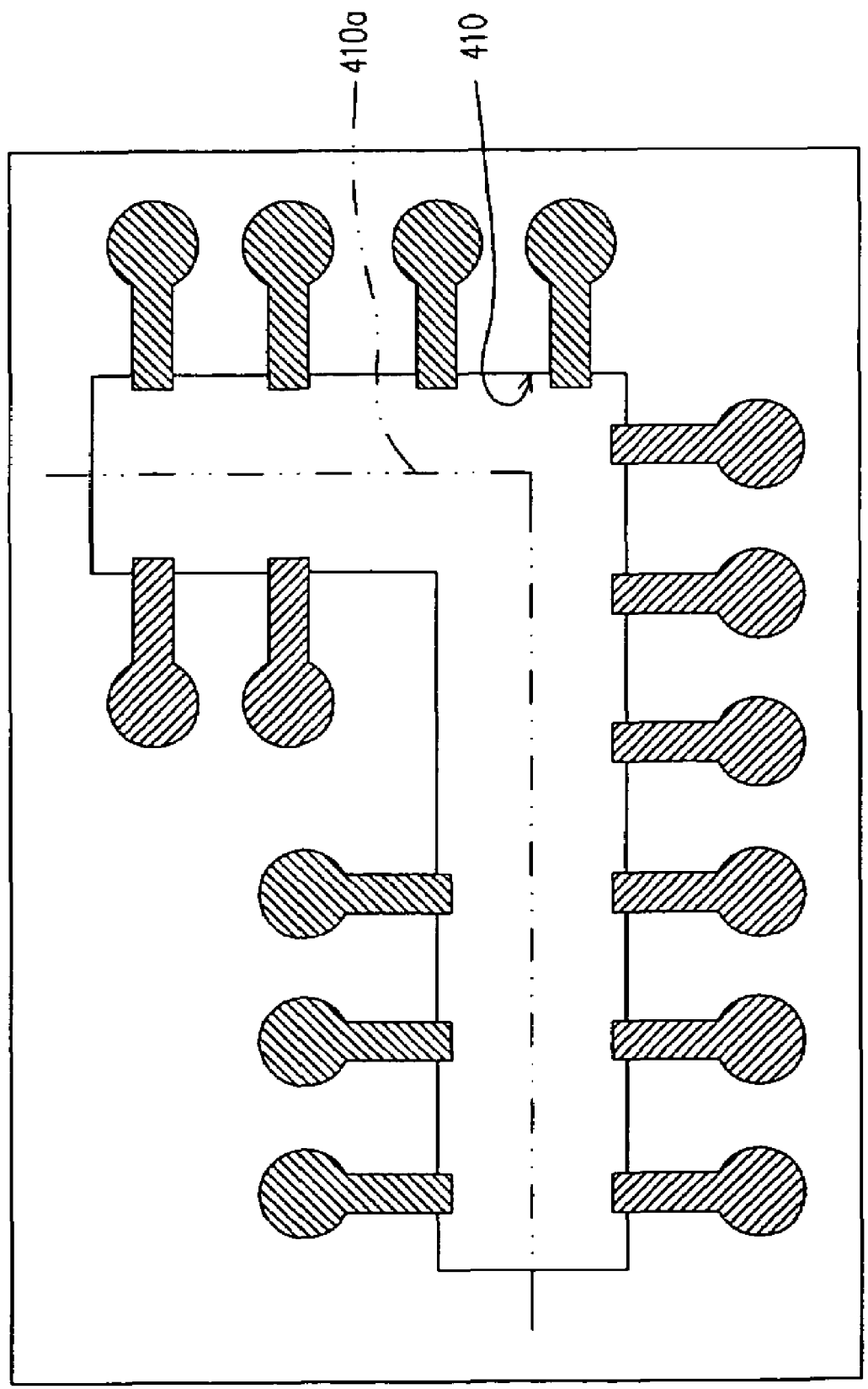
FIGS. 4A through 4C are schematic top views showing a portion of various types of linear slots in a circuit substrate.
Figure 4B:
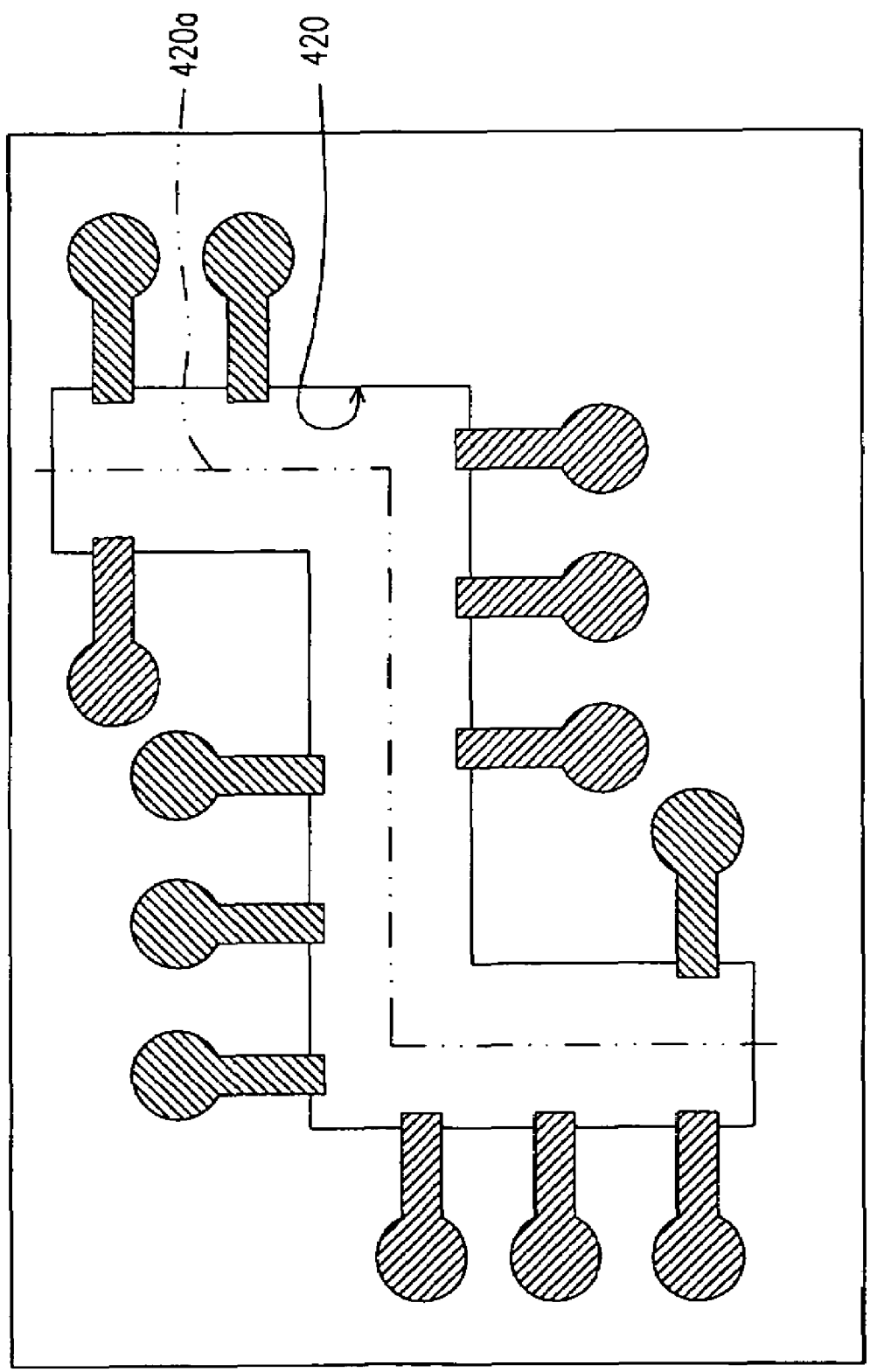
Figure 4C:
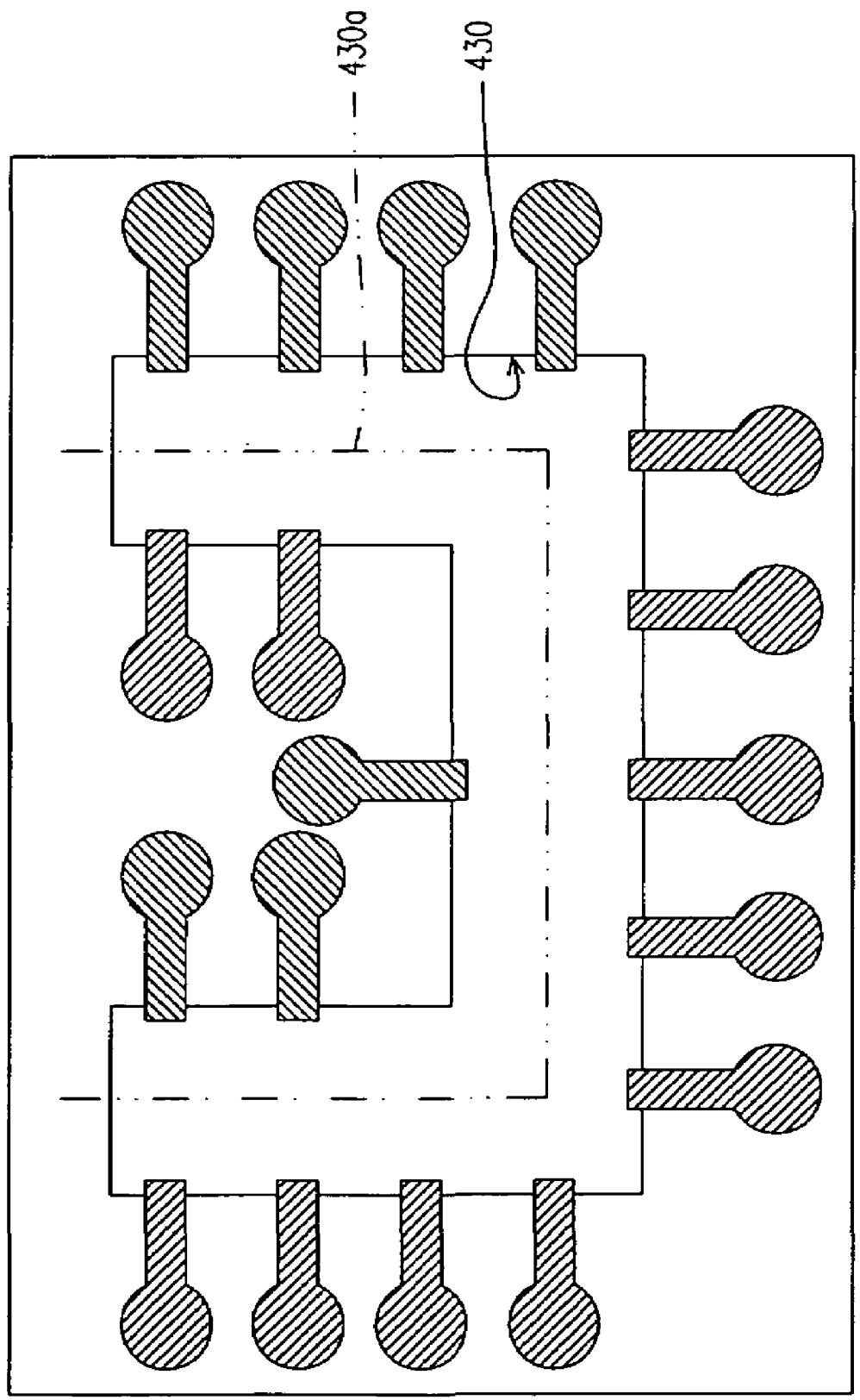

Furthermore, as shown in FIG. 3, the central extension line 308 of the linear slot 302c is an open line segment. Thus, the external profile of the linear slot 302c is not limited to an I-shape linear slot as shown in FIGS. 2 and 3. FIGS. 4A through 4C are schematic top views showing a portion of various types of linear slots in a circuit substrate. To simplify FIGS. 4A through 4C, only the stack layer and the plated through hole of the circuit substrate is shown. In FIG. 4A, an L-shaped linear slot 410 having an L-shaped central extension line 410a is shown. In FIG. 4B, an S-shaped linear slot 420 having an S-shaped central extension line 420a is shown. In FIG. 4C, a U-shaped linear slot 430 having a U-shaped central extension line 430a is shown.

Figure 5A:
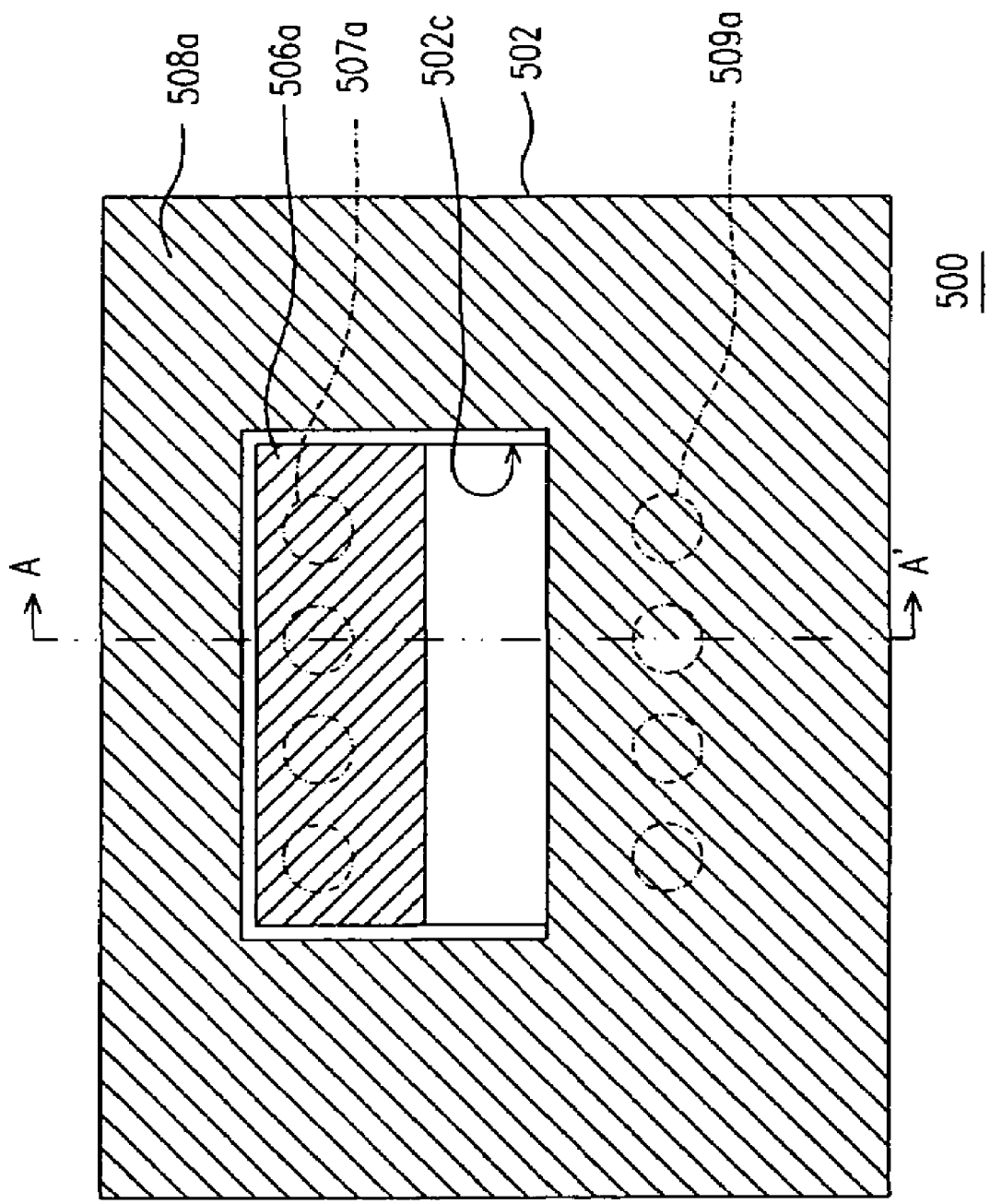
FIGS. 5A, 5B, and 5C are respectively a schematic top view, a schematic bottom perspective view, and a schematic cross-sectional view along line A-A' of a circuit substrate according to another embodiment of the present invention.
Figure 5B:
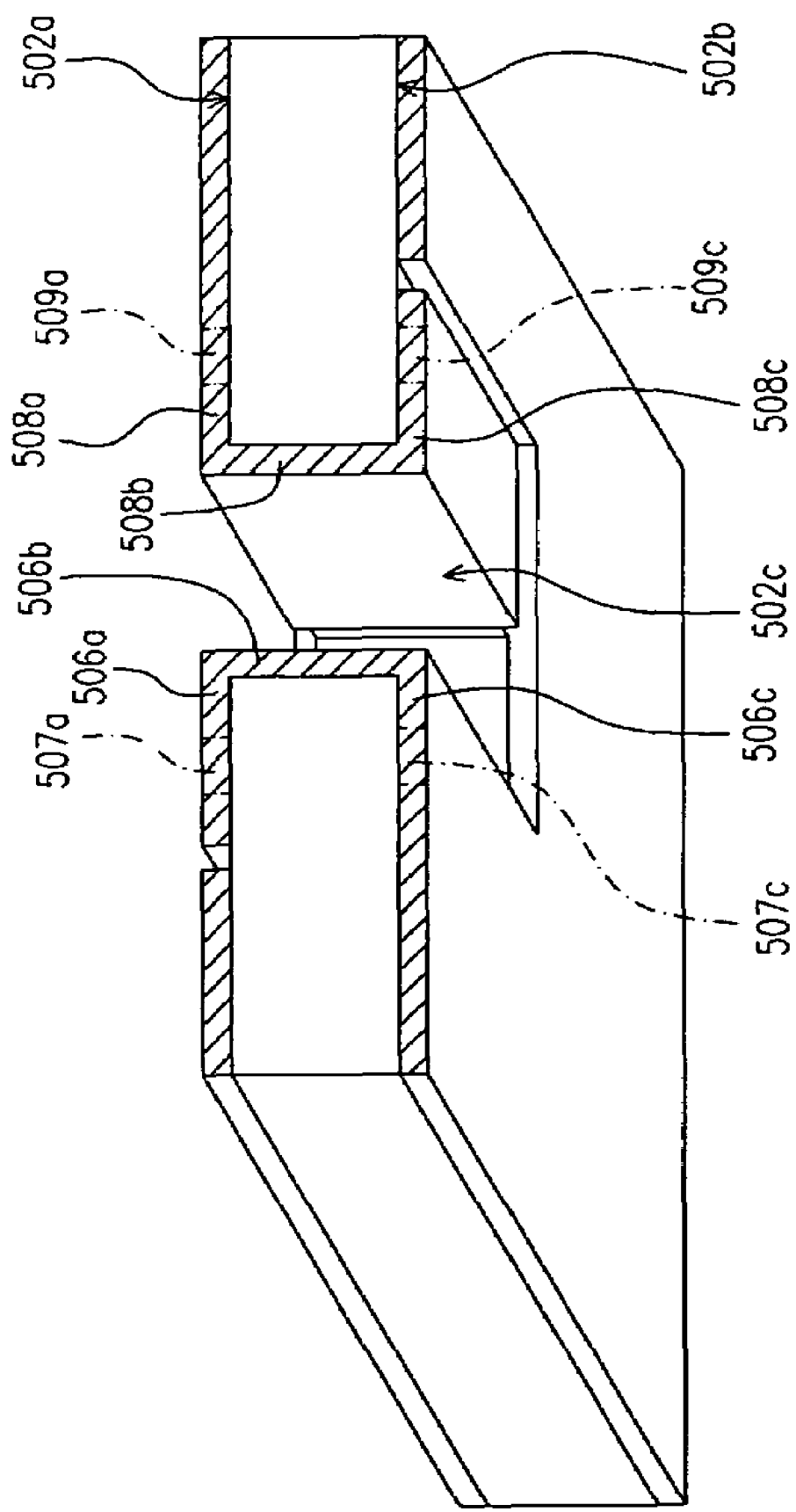
Figure 5C:
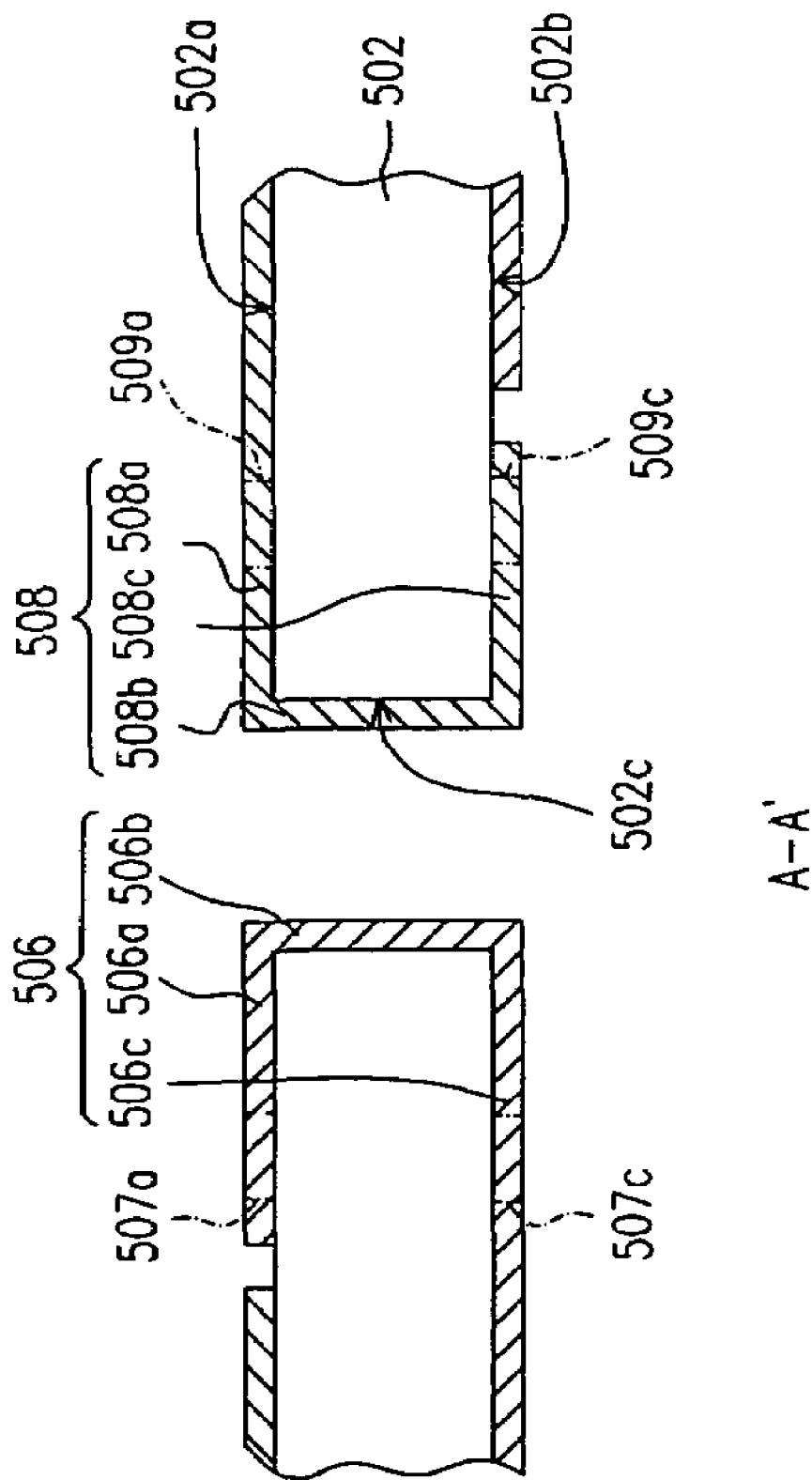

Aside from the aforementioned embodiment, the plated through hole of the present invention can be used to connect a power plane and a ground plane in the circuit substrate. FIGS. 5A, 5B, and 5C are respectively a schematic top view, a schematic bottom perspective view, and a schematic cross-sectional view along line A-A' of a circuit substrate according to a second embodiment of the present invention. To simplify FIG. 5A, only the stack layer, the power plane and the plated through hole of the circuit substrate are shown. Similarly, to simplify FIG. 5C, only the stack layer, the power plane, the ground plane and the plated through hole of the circuit substrate are shown. As shown in FIGS. 5A, 5B, and 5C, an upper power plane 506a and an upper ground plane 508a are disposed on an upper surface 502a of a stack layer 502 of a circuit substrate 500. The upper ground plane 508a surrounds the upper power plane 506a. Furthermore, the upper power plane 506a has a plurality of first upper contact pads 507a and the upper ground plane 508a has a plurality of second upper contact pads 509a, for example. Similarly, a lower power plane 506c and a lower ground plane 508c are disposed on a lower surface 502b of the stack layer 502 of the circuit substrate 500. The lower power plane 506c surrounds the lower ground plane 508c. Furthermore, the lower power plane 506c has a plurality of first lower contact pads 507c and the lower ground plane 508c has a plurality of second lower contact pads 509c, for example. In addition, the stack layer 502 has an I-shaped linear slot 502c and the linear slot 502c has a first slot conductive wall 506b and an independent second slot conductive wall 508b. The first slot conductive wall 506b connects the upper power plane 506a with the lower power plane 506c to form a first transmission pathway 506 (slashed area) and provide a power connection. The second slot conductive wall 508b connects the upper ground plate 508a with the lower ground plane 508c to form a second transmission pathway 508 (slashed area) and provide a ground connection.

The present invention also provides a method of fabricating a circuit substrate having slot-shaped plated through holes. FIGS. 6A through 6E are schematic top views showing the steps for fabricating a plated through hole according to one preferred embodiment of the present invention. FIGS. 7A through 7E are schematic cross-sectional views along line B-B' of FIGS. 6A through 6E.

As shown in FIGS. 6A and 7A, a stack layer 602 having an upper conductive layer 604a and a lower conductive layer 604b are provided. The upper conductive layer 604a and the lower conductive layer 604b are formed on the upper surface 602a and the lower surface 602b of the stack layer 602 respectively. For example, the structure is formed by attaching a copper foil to the upper and lower surface of a dielectric layer or performing an electroplating process to coat a conductive layer on the upper and lower surface of a substrate.

As shown in FIGS. 6B and 7B, a linear slot 602c is formed passing through the stack layer 602, the upper conductive layer 604a and the lower conductive layer 604b. The method of forming the linear slot 602c comprises performing a milling operation along a cutting path using a cutting tool, for example. The cutting path is an open segment such as an I-line, an L-line, S-line or a U-line. Alternatively, a mechanical punching process can be performed to form the linear slot 602c.

As shown in FIGS. 6C and 7C, a slot conductive layer 604c is formed on the inner wall of the linear slot 602c. In the process of forming the slot conductive layer 604c, a thin electroplated seed layer (not shown) may form on the inner wall of the linear slot 602c before electroplating a metallic layer (not shown) over the seed layer. Hence, slot conductive layer 604c comprises a seed layer and a metallic layer.

Figures 6D, 7D:
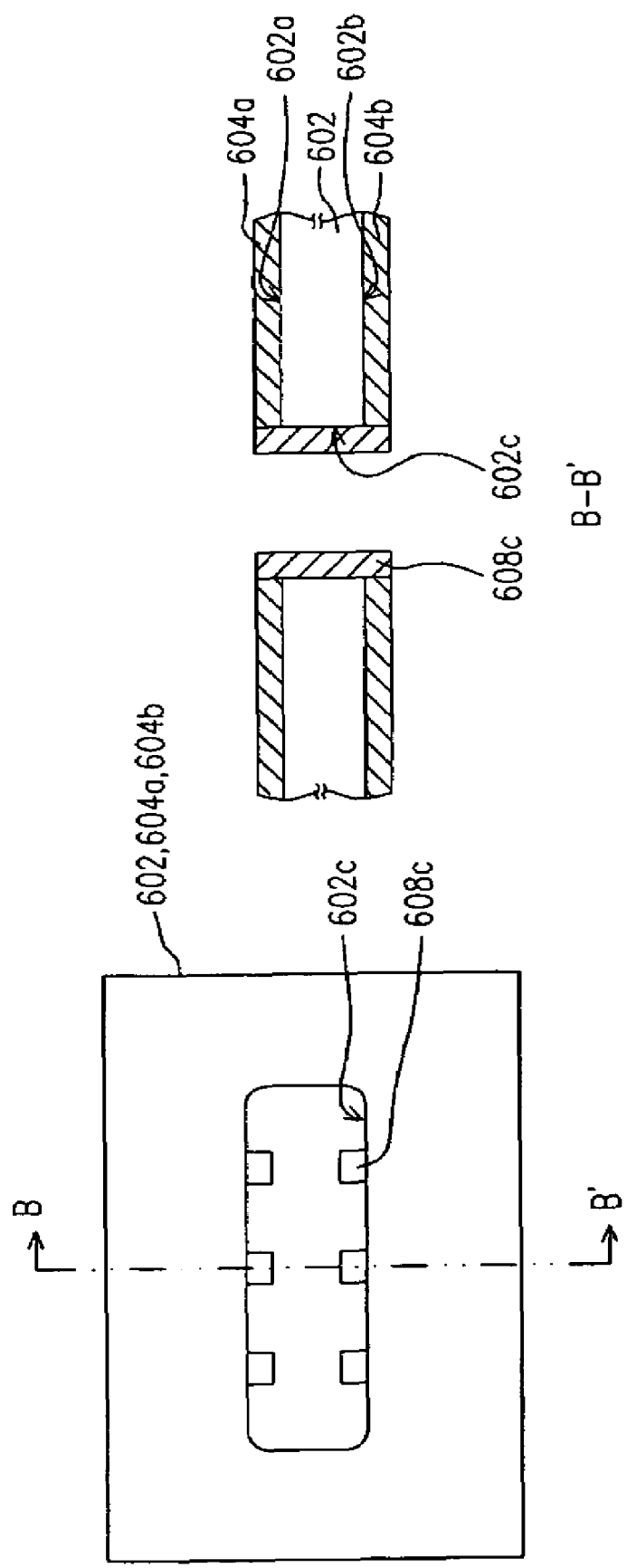

As shown in FIGS. 6D and 7D, portions of the slot conductive layer 604c is removed to form a plurality of independent slot line segments 608c. Some of the material in the slot conductive layer 604c can be removed through mechanical drilling or laser drilling, for example.

It should be noted that the present invention also permits the removal of portions of the electroplated seed layer before performing an electroplating process to form a metallic layer over the remaining electroplated seed layer. Hence, the remaining electroplated seed layer and the metallic layer together form a plurality of slot line segments. Furthermore, in one preferred embodiment of the present invention, a dielectric material is deposited into the linear slot to cover the slot line segments after forming the slot line segments. The dielectric material can be ink for plugging holes, for example. In addition, a grinding operation may be carried out after depositing the dielectric material into the linear slot to reduce the thickness of the upper conductive layer and the lower conductive layer.

As shown in FIGS. 6E and 7E, the upper conductive layer 604a and the lower conductive layer 604b are patterned to form a plurality of independent upper contact pads 606a and correspondingly linked upper line segments 608a on the upper surface 602a of the stack layer 602 and a plurality of independent lower contact pads 606b and correspondingly linked lower line segments 608b on the lower surface 602b of the stack layer 602. Hence, each corresponding upper line segment 608a, slot line segment 608c and lower line segment 608b together form a transmission line 606c and each corresponding upper contact pad 606a, transmission line 606c and lower contact pad 606b together form a transmission pathway 606.

Figure 8:
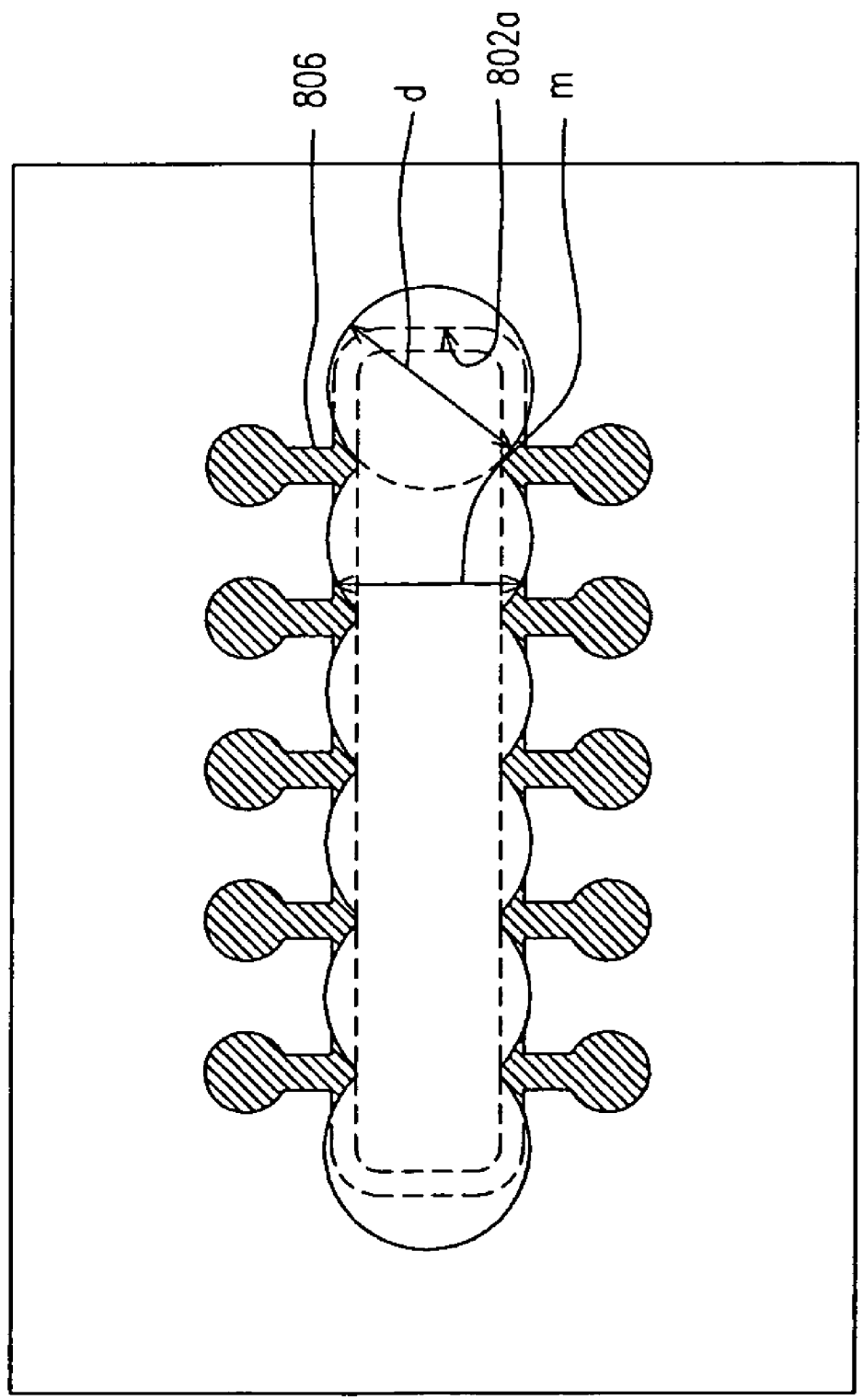

In other words, the method for fabricating a plated through hole in a circuit substrate according to the present invention is capable of producing a slot-shaped plated through hole having a plurality of independent transmission pathways therein so that a multiple of signals can be transmitted simultaneously. Furthermore, the present invention also permits the conventional drilling bits for forming circular through hole to remove conductive material from the linear slot. FIGS. 8 and 9 are schematic top views showing the process of removing the conductive layer inside a slot using circular drill bits for fabricating a plated through hole according to the present invention. As shown in FIG. 8, a series of mutually linked drill holes is sequentially formed along the axial direction of the linear slot 802a. The drill holes have an outer diameter d slightly bigger than or equal to the width m of the linear slot 802a. Thus, each drilling operation produces a pair of signal transmission pathways 806 on each side of the linear slot 802a thereby speeding up the processing operation.

In addition, as shown in FIGS. 5A and 5B, the hole drilling operation may proceed to remove portions of the slot conductive layer (not shown) on one side only so that different slot line segments (the slot conductive walls 506b, 508b) are isolated. When the upper conductive layer and the lower conductive layer are patterned, an upper power plane 506a, an upper ground plane 508a, a lower power plane 506c and a lower ground plane 508c are formed on the upper and lower surface of the stack layer. Consequently, a first transmission pathway 506 for connecting to the power and a second transmission pathway 508 for connecting to the ground are formed. Obviously, aside from forming the power transmission pathway and the ground transmission pathway, two or more transmission pathways each serving a different function can be formed inside the same slot-shaped plated through hole. As shown in FIG. 9, the slot-shaped plated through hole includes a signal transmission pathway 912, a power transmission pathway 914 and a ground transmission pathway 916 passing through the linear slot 902a.

In summary, the present invention provides a circuit substrate with slot-shaped plated through holes and method of fabricating the slot-shaped plated through holes. A milling or mechanical punching operation is used to form the linear slot in the circuit substrate and a drilling operation is used to form the transmission pathways inside the linear slot. Therefore, the circuit substrate and method of manufacturing the plated through slots according to the present invention has at least the following characteristics.

1. Each plated through hole provides a plurality of transmission pathways so that several signals can be transmitted simultaneously. Hence, the level of circuit integration can be increased.

2. Because each plated through hole is able to provide a plurality of transmission pathways, the number of drilling in the circuit substrate can be reduced correspondingly. In other words, the circuit substrate can provide more surface area for laying circuits. Moreover, the average routing length of wires on the circuit substrate is reduced.

3. Although a linear slot instead of a circular slot is used in the design, drilling operations can still be applied to form a multiple of transmission pathways inside the linear slot. Thus, the target of having a high productivity and a low production cost for producing the circuit substrate can still be achieved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A circuit substrate, comprising:
   a stack layer having a first surface and a second surface, wherein the stack layer has a linear slot with a central extension line and the linear slot passes through the stack layer;
   a first upper conductive plane disposed on the first surface of the stack layer;
   at least a second upper conductive plane disposed on the first surface of the stack layer around the first upper conductive plane;
   a first lower conductive plane disposed on the second surface of the stack layer;
   at least a second lower conductive plane disposed on the second surface of the stack layer, and the first lower conductive plane is around the second lower conductive plane;
   a first slot conductive wall disposed on an inner wall of the linear slot for connecting the first upper conductive plane with the first lower conductive plane; and
   at least a second slot conductive wall disposed on the inner surface of the linear slot independent from the first slot conductive wall for connecting the second upper conductive plane with the second lower conductive plane.

2. The circuit substrate of claim 1, wherein the first upper conductive plane comprises a power plane while the first lower conductive plane comprises a power plane, and the second upper conductive plane comprises a ground plane while the second lower conductive plane comprises a ground plane.

3. The circuit substrate of claim 1, wherein the stack layer comprises a single dielectric layer.

4. The circuit substrate of claim 1, wherein the stack layer comprises a plurality of dielectric layers and at least a conductive layer and the conductive layer is disposed between a pair of the neighboring dielectric layers.

5. The circuit substrate of claim 1, wherein the central extension line of the linear slot is an open line segment.

6. The circuit substrate of claim 5, wherein the shape of the central extension line is selected from a group consisting of I-shape, L-shape, S-shape and U-shape line.

7. The circuit substrate of claim 1, further comprises a dielectric material that fills the linear slot and covers the first slot conductive wall and the second slot conductive wall.

8. The circuit substrate of claim 1, wherein the first upper conductive plane has a plurality of first upper contact pads, the second conductive plane has a plurality of second upper contact pads, the first lower conductive plane has a plurality of first lower contact pads, and the second lower conductive plane has a plurality of second lower contact pads.

9. A circuit substrate, comprising:
- a stack layer having a first surface and a second surface, wherein the stack layer has a linear slot with a central extension line, the linear slot comprises a single continuous inner surface, and the linear slot passes through the stack layer;
- a first upper conductive plane disposed on the first surface of the stack layer;
- at least a second upper conductive plane disposed on the first surface of the stack layer around the first upper conductive plane;
- a first lower conductive plane disposed on the second surface of the stack layer;
- at least a second lower conductive plane disposed on the second surface of the stack layer, and the first lower conductive plane is around the second lower conductive plane;
- a first slot conductive wall disposed on a first portion of the single continuous inner surface of the linear slot for connecting the first upper conductive plane with the first lower conductive plane; and
- at least a second slot conductive wall disposed on a second portion of the single continuous inner surface of the linear slot independent from the first slot conductive wall for connecting the second upper conductive plane with the second lower conductive plane.

10. The circuit substrate of claim 9, wherein the first upper conductive plane comprises a power plane while the first lower conductive plane comprises a power plane, and the second upper conductive plane comprises a ground plane while the second lower conductive plane comprises a ground plane.

11. The circuit substrate of claim 9, wherein the stack layer comprises a single dielectric layer.

12. The circuit substrate of claim 9, wherein the stack layer comprises a plurality of dielectric layers and at least a conductive layer and the conductive layer is disposed between a pair of the neighboring dielectric layers.

13. The circuit substrate of claim 9, wherein the central extension line of the linear slot is an open line segment.

14. The circuit substrate of claim 13, wherein the shape of the central extension line is selected from a group consisting of I-shape, L-shape, S-shape and U-shape line.

15. The circuit substrate of claim 9, further comprises a dielectric material that fills the linear slot and covers the first slot conductive wall and the second slot conductive wall.

16. The circuit substrate of claim 9, wherein the first upper conductive plane has a plurality of first upper contact pads, the second conductive plane has a plurality of second upper contact pads, the first lower conductive plane has a plurality of first lower contact pads, and the second lower conductive plane has a plurality of second lower contact pads.

* * * * *